United States Patent [19]

Pasco et al.

[11] Patent Number: 4,678,683
[45] Date of Patent: Jul. 7, 1987

[54] PROCESS FOR COFIRING STRUCTURE COMPRISED OF CERAMIC SUBSTRATE AND REFRACTORY METAL METALLIZATION

[75] Inventors: Wayne D. Pasco, Scotia; Ronald H. Arendt, Schenectady, both of N.Y.

[73] Assignee: General Electric Company, Schenectady, N.Y.

[21] Appl. No.: 808,707

[22] Filed: Dec. 13, 1985

[51] Int. Cl.$^4$ ............................................. B05D 5/12
[52] U.S. Cl. ................................... 427/123; 156/89; 427/96; 427/380; 427/383.5; 501/96; 501/120; 501/128
[58] Field of Search ............... 427/123, 376.7, 383.3, 427/383.5, 380, 227, 287; 501/120, 128, 96; 106/84; 156/89

[56] References Cited

U.S. PATENT DOCUMENTS

| | | | |
|---|---|---|---|
| 2,139,431 | 12/1938 | Vatter | 427/376.7 |
| 2,667,427 | 1/1954 | Nolte | 427/383.5 |
| 3,852,877 | 12/1974 | Ahn et al. | 156/89 |
| 3,978,248 | 8/1976 | Usami | 427/383.5 |
| 4,126,474 | 11/1978 | Talley et al. | 501/125 |
| 4,234,367 | 11/1980 | Herron et al. | 156/89 |
| 4,340,618 | 7/1982 | Fury et al. | 427/383.5 |
| 4,504,339 | 3/1985 | Kamehara et al. | 156/89 |
| 4,540,621 | 9/1985 | Eggerding et al. | 427/96 |
| 4,571,414 | 2/1986 | Renlund et al. | 501/128 |

*Primary Examiner*—Sadie L. Childs
*Attorney, Agent, or Firm*—Jane M. Binkowski; James C. Davis, Jr.; Paul R. Webb, II

[57] ABSTRACT

A cofired structure comprised of a refractory metal metallization supported by a substrate free of large voids is produced by forming a liquid phase sinterable ceramic composition containing $SiO_2$ in some form and a sulfate of an alkali metal and/or an alkaline earth metal, admixing the composition with an organic binding medium, shaping the mixture into a thin sheet, contacting the sheet with refractory metal metallization material, and cofiring the resulting structure whereby the free carbon produced by pyrolysis of the organic medium is removed by reaction with the sulfate before closed porosity is initiated.

31 Claims, No Drawings

PROCESS FOR COFIRING STRUCTURE COMPRISED OF CERAMIC SUBSTRATE AND REFRACTORY METAL METALLIZATION

This invention relates to the cofiring of a structure comprised of a ceramic substrate and refractory metal metallization material. More specifically, this invention is directed to the use of a sulfate of an alkali metal or alkaline earth metal as an oxidizing agent for the removal of elemental carbon from the substrate before initiation of closed porosity therein during cofiring of the structure.

Thin ceramic sheet for electronic substrate applications is most conveniently formed through the use of a mixture of a sinterable ceramic composition and selected organic material. Generally, the ceramic composition is comprised of ceramic powder, usually alumina, and a sufficient amount of a material which forms a liquid at sintering temperature to enable liquid phase sintering of the ceramic. The liquid forming material includes $SiO_2$ in some form. The organic material enables formation of the required thin sheet. Refractory metal metallization material is contacted with the green sheet and/or a stack thereof, and the resulting structure is cofired to produce the desired sintered product such as, for example, a ceramic chip carrier. The structure must be fired, i.e. cofired, in an atmosphere which is nonoxidizing with respect to the refractory metal. On cofiring the structure in such an environment, the organic material decomposes leaving a residue of elemental carbon. When the temperature is increased to above about 1250° C., the carbon reacts with silica producing carbon monoxide and silicon monoxide gases which form large voids and/or large gas-filled voids, generally ranging from about 15 microns to 30 microns, in the sintered sheet, i.e. sintered ceramic substrate. In order to control the final density and dimensions of the substrate, these large voids must be eliminated, and this requires the removal of elemental carbon from the substrate prior to formation of closed porosity therein during cofiring. An atmosphere which is sufficiently oxidizing to remove elemental carbon in a reasonably short time would oxidize the refractory metal and therefore cannot be used. As a result, it has been found to be extremely difficult to remove the carbon using traditional atmosphere mediated means because of the reducing or nonoxidizing atmospheres required to maintain the refractory metal.

The present invention eliminates the formation of large voids in the ceramic substrate by the in situ oxidation of elemental carbon thereby removing it from the substrate. Specifically, a sulfate of an alkali metal or alkaline earth metal is used to react with the elemental carbon forming carbonaceous gaseous product which vaporizes away.

Briefly stated, the present process is directed to producing a sintered structure comprised of a ceramic substrate and an adherent electrically conductive refractory metal metallization wherein said substrate is free of voids greater than about 5 microns and has a porosity of less than about 10% by volume which comprises forming a liquid phase sinterable ceramic composition containing silica and/or a source thereof and an oxidizing agent, admixing said composition with an organic binding material, said organic binding material pyrolyzing at an elevated temperature ranging to less than about 800° C. leaving a residue of elemental carbon, said oxidizing agent being selected from the group consisting of alkali metal sulfate, alkaline earth metal sulfate and mixtures thereof and being used in an amount at least sufficient to react with the total amount of said residue of carbon, forming said mixture into a sheet, contacting said sheet with a refractory metal metallization material, firing the resulting structure at an elevated pyrolyzing temperature ranging to less than about 800° C. pyrolyzing said organic binding material thereby leaving a residue of elemental carbon in the sheet, increasing the firing temperature to a decarburizing temperature ranging from about 800° C. to about 1200° C. but below the temperature at which closed porosity forms in the sheet reacting said oxidizing agent with said carbon thereby decarburizing the sheet, and increasing the firing temperature to a sintering temperature producing said sintered structure, said firing being carried out in an atmosphere or vacuum which is nonoxidizing with respect to said refractory metal.

By closed porosity it is meant herein closed pores or voids not open to the surface of the compact or body and therefore not in contact with the ambient atmosphere. The closed porosity would be produced by the sintering together of ceramic particles.

In the present invention, the sinterable ceramic composition is one which can be liquid phase sintered at a temperature below the melting temperature of the refractory metal it is in contact with or supports during sintering. The sinterable ceramic composition is comprised of ceramic powder and an amount of liquid-forming material which is at least sufficient to enable the liquid phase sintering of the ceramic powder to produce the present substrate having a porosity of less than about 10% by volume of the substrate. Specifically, the liquid-forming material is a solid material which forms a liquid in situ at sintering temperature in an amount which enables liquid phase sintering of the ceramic composition to produce the present cofired sintered structure. Generally, the liquid-forming material is present in an amount of at least about 1% by weight, frequently ranging from about 1% by weight to about 15% by weight, and more frequently from about 2% by weight to about 10% by weight, of the sinterable ceramic composition.

Representative of useful ceramic powders is alumina, aluminum nitride, mullite-cordierite compositions and silicon nitride. Generally, the ceramic powder is alumina.

The liquid-forming material contains $SiO_2$ and/or a source thereof such as aluminum silicate or a silicate and/or aluminosilicate of an alkaline earth metal and/or alkali metal. For example, the liquid-forming material can contain sodium silicate, potassium silicate, barium silicate, calcium silicate, magnesium silicate, strontium silicate, sodium aluminosilicate, potassium aluminosilicate, barium aluminosilicate, calcium aluminosilicate, magnesium aluminosilicate, strontium aluminosilicate and mixtures thereof. The $SiO_2$ in some form is present in at least a significant amount, i.e. an amount which, if it were reacted with the elemental carbon during firing of the substrate, would be at least sufficient to produce large voids in the substrate of the order of about 15$\mu$ to about 30$\mu$ in the sintered substrate. Generally, the $SiO_2$ in some form is present in an amount at least about 0.5% by weight, usually at least about 1% by weight, and typically ranges from about 1% by weight to about 3% by weight, of the sinterable ceramic composition.

The liquid-forming material also contains the present oxidizing agent which is a sulfate of an alkali metal, an alkaline earth metal or mixtures thereof. Preferably, the oxidizing agent is selected from the group consisting of sodium sulfate, potassium sulfate, barium sulfate, calcium sulfate, magnesium sulfate, strontium sulfate and a mixture thereof.

During the present cofiring, the sulfate reacts with the elemental carbon forming gaseous carbonaceous product which vaporizes away leaving a residue of oxide and/or substantially an oxide of the alkali metal or alkaline earth metal which, on subsequent sintering, becomes part of the liquid sintering phase. Generally, the carbonaceous gaseous product includes CO, COS, $CO_2$ and possibly $CS_2$, and usually, a major portion of the gaseous product is comprised of CO and COS. The particular sulfate used depends largely on the effect, if any, its cation may have on the application of the final product. For example, for electronic substrates the alkaline earth metal sulfate should be used because of the electronically deleterious effect of the alkali cation. Reaction (1) is illustrative of the major reaction which occurs:

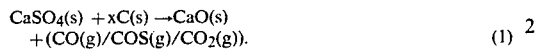

$$CaSO_4(s) + xC(s) \rightarrow CaO(s) + (CO(g)/COS(g)/CO_2(g)). \quad (1)$$

The particular composition of the liquid-forming material can vary widely and depends largely on the particular ceramic powder to be sintered and the particular composition desired in the sintered substrate for a particular application. The specific liquid-forming composition can be determined empirically or it can be calculated by conventional techniques. The liquid-forming composition must contain a monovalent or divalent cation which can be provided by the present oxidizing agent. For example, the liquid-forming material can be comprised of $SiO_2$ and the present oxidizing agent. Also, it can be comprised of the present oxidizing agent and a member of the group consisting of calcium silicate, calcium aluminosilicate, magnesium silicate, magnesium aluminosilicate, aluminum silicate, and mixtures thereof.

The liquid-forming material can contain an oxide such as calcium oxide, magnesium oxide, aluminum oxide and mixtures thereof.

Frequently, the present liquid-forming material is a glass-forming material. Therefore, the present liquid-forming material can be produced by adding the present oxidizing agent to a known glass-forming composition, or by substituting the present oxidizing agent for a component, or portion thereof, of a known glass-forming composition. For example, calcium sulfate can be substituted for calcium silicate in a known glass-forming composition.

The organic binding material used in the present process bonds the particles together and enables formation of the required thin sheet of desired solids content. By solids content, it is meant herein the content of sinterable ceramic composition which includes the present oxidizing agent. The organic binding material pyrolyzes, i.e. thermally decomposes, at an elevated temperature ranging to below about 800° C., generally from about 50° C. to below about 800° C., and preferably from about 100° C. to about 500° C., to elemental carbon and gaseous product of decomposition which vaporize away.

The organic binding material is a thermoplastic material with a composition which can vary widely and which is well known in the art or can be determined empirically. Besides an organic polymeric binder it can include an organic plasticizer therefor to impart flexibility. The amount of plasticizer can vary widely depending largely on the particular binder used and the flexibility desired, but typically, it ranges up to about 50% by weight of the total organic content. Preferably the organic binding material is soluble in a volatile solvent.

Representative of useful organic binders are polyvinyl acetates, polyamides, polyvinyl acrylates, polymethacrylates, polyvinyl alcohols, polyvinyl butyrals, and polystyrenes. The useful molecular weight of the binder is known in the art or can be determined empirically. Ordinarily, the organic binder has a molecular weight at least sufficient to make it retain its shape at room temperature and generally such a molecular weight ranges from about 20,000 to about 80,000. It is the organic binder that leaves most of the carbon residue in the substrate.

Representative of useful plasticizers are dioctyl phthalate, dibutyl phthalate, polyethylene glycol and glycerol trioleate.

In carrying out the present process, the sinterable ceramic composition and organic binding material are admixed to form a uniform or at least a substantially uniform mixture or suspension which is formed into a sheet of desired thickness and solids content. A number of conventional techniques can be used to form the mixture and resulting green sheet. Generally, the components are milled in an organic solvent in which the organic material is soluble or at least partially soluble to produce a castable mixture or suspension. Examples of suitable solvents are methyl ethyl ketone, toluene and alcohol. The mixture or suspension is then cast into a sheet of desired thickness in a conventional manner, usually by doctor blading which is a controlled spreading of the mixture or suspension on a carrier from which it can be easily released such as Teflon. The cast sheet is dried to evaporate the solvent therefrom to produce the present green sheet which is then removed from the carrier.

The particle size of the solids content of the present mixture or suspension can vary widely depending largely on the particular substrate to be formed and is determinable empirically. Generally, the solids in the mixture and resulting green sheet have a specific surface area of less than about 10 m²/g, and frequently from about 1.5 m²/g to about 4 m²/g, according to BET surface area measurement.

The particular amount of organic binding material used in forming the mixture is determinable empirically and depends largely on the amount and distribution of solids desired in the resulting green sheet. Generally, the organic binding material ranges from about 25% by volume to about 50% by volume of the solids content of the mixture and green sheet.

The oxidizing agent should be used at least in an amount sufficient to react with the total amount of elemental carbon produced by pyrolysis of the organic binding material which is determinable empirically. For example, the actual amount of elemental carbon introduced by pyrolysis of the organic binding material can be determined by pyrolyzing the organic material alone under the same conditions used in the present cofiring and determining weight loss. Generally, the oxidizing agent ranges from about 0.5% by weight to about 5% by weight, and frequently from about 1% by weight to about 3% by weight, of the liquid phase sinterable ceramic composition.

The thickness of the present green sheet can vary widely depending largely on its particular application. Generally, however, its thickness ranges from about 0.1 mm to about 1 mm. Preferably, the present green sheet is of uniform or at least of substantially uniform thickness.

The refractory metal metallization material is a metallization-forming material, i.e. during the present cofiring it forms the electrically conductive refractory metal phase on the substrate. Generally, the metallization material is known in the art and is available commercially. Usually it is in the form of a paste or ink of the refractory metal particles suspended in organic binder and solvent. Frequently, the metallization material also contains some glass frit which aids in the adherence of the metal to the substrate. Generally, the refractory metal particles range in size from about 0.1 micron to about 20 microns.

The refractory metal can be any metal whose particles can be sintered together during sintering of the present sinterable ceramic composition to produce a continuous electrically conductive phase. The refractory metal must be a solid during sintering of the ceramic composition, and preferably, it is tungsten or molybdenum. In the present process, the refractory metal should not react with the ceramic substrate.

The metallization material can be contacted with the green sheet by a number of conventional techniques. Generally, it is deposited or printed thereon and/or therein in a preselected pattern. Usually, it is screen printed thereon. The resulting structure is then cofired.

In the fabrication of a monolithic body having a multi-layered ceramic substrate, a plurality of green sheets would be produced and the metallization material would be contacted with or printed on most, if not all, of them in a preselected pattern. Vias or feed-through holes may be punched in the sheets as required for layer interconnection and filled with the metallization material usually in the form of a paste. The sheets are then stacked together, i.e. superimposed on each other, in a preselected manner generally forming a sandwich. The stack can be laminated under a pressure and temperature determinable largely by its particular composition, but usually lower than about 100° C., to form a laminated structure which is then cofired.

The present structure is cofired to produce a sintered structure comprised of a sintered ceramic substrate free of voids greater than about 5 microns and an adherent electrically conductive phase of refractory metal. At a cofiring temperature of less than about 800° C., the pyrolysis of the organic material is completed leaving a residue of elemental carbon in at least a significant amount, i.e. an amount which would produce voids greater than about $15\mu$ if it were reacted with the $SiO_2$ or form thereof in the substrate. Generally, the amount of elemental carbon produced by pyrolysis is at least about 0.05% by volume, and usually at least about 0.4% by volume, of the substrate.

When the cofiring temperature is increased to a range of from about 800° C. to about 1200° C., but below the temperature at which closed porosity is initiated in the substrate, the oxidizing agent reacts with the elemental carbon producing carbonaceous gases which vaporize away through the open porosity of the substrate thereby removing the elemental carbon from the substrate. The cofiring temperature is then increased to the sintering temperature at which the decarburized ceramic substrate densifies to produce a ceramic substrate having a porosity of less than about 10% by volume, preferably less than about 5% by volume, and more preferably, less than about 1% by volume of the substrate.

During sintering, the ceramic powder is liquid-phase sintered producing a ceramic substrate of desired density, and the refractory metal particles are sintered together producing a continuous electrically conductive phase. During sintering, a portion of the liquid phase which enables sintering of the ceramic migrates into the interstices between the sintering refractory metal particles by capillarity resulting in a phase, usually a glassy phase, intermingled with the continuous phase of refractory metal which aids in the adherence of the refractory metal phase to the substrate. The sintering temperature can vary widely depending largely on the particular ceramic composition, but generally it is above 1300° C. and usually ranges from about 1350° C. to about 1900° C. For example, for a sinterable liquid phase alumina composition, it can range from about 1450° C. to about 1700° C.

In the present cofiring, the rate of heating is determinable empirically and depends largely on the thickness of the sample and on furnace characteristics. Generally, in the firing temperature range up to about 500° C., a slower heating rate is desirable because of the larger amount of gas generated at these temperatures by the decomposition of the organic binding material. Typically, the heating rate for a sample of less than about 6 mm thickness can range from about 1° C. per minute to about 8° C. per minute.

The present cofiring process is carried out in an atmosphere or vacuum in which the ceramic substrate and refractory metal are inert or substantially inert, i.e. an atmosphere or vacuum which has no significant deleterious effect thereon. Specifically, the atmosphere or vacuum should be nonoxidizing with respect to the refractory metal and the ceramic substrate. Preferably, the process is carried out in a dry atmosphere or vacuum, i.e. an atmosphere or vacuum having a dew point of less than about 60° C., and more preferably less than about 40° C. Representative of a useful atmosphere is dissociated ammonia, nitrogen, hydrogen, a noble gas and mixtures thereof. Preferably, a reducing atmosphere containing at least about 1% by volume of hydrogen, and more preferably at least about 5% by volume of hydrogen, is used to insure maintenance of sufficiently low oxygen partial pressure. Preferably, the atmosphere is at ambient pressure.

Upon completion of the cofiring, the resulting structure is allowed to cool, preferably to ambient temperature. The rate of cooling can vary and is not critical, but it should have no significant deleterious effect on the structure. Preferably, it is furnace cooled to ambient temperature.

The present substrate has a porosity of less than about 10% by volume, preferably less than about 5% by volume, more preferably less than 1% by volume, and most preferably, it is pore-free, i.e., it is fully dense.

The present process produces a product which has a number of uses. The product can be brazed via the metallization to another metallic part making is useful as a socketed, or leaded device as part of an integrated circuit. Also, the metallization, after being plated initially with nickel and then with gold, as is conventionally done in the production of chip carriers to prevent oxidation of the metallization, could have wires diffusion bonded thereto making the product useful as a chip carrier in computers.

The invention is further illustrated by the following examples wherein the procedure was as follows unless otherwise stated:

All of the examples were carried out in a molybdenum retort furnace in an atmosphere at ambient pressure.

The alumina powder had an average particle size of about 3μ.

The silica powder had an average particle size of about 1.5μ.

The talc ($MgSiO_3$) powder had an average particle size of about 0.5 micron.

The calcium sulfate powder had an average particle size of about 0.2 micron.

The Wollastonite ($CaSiO_3$) powder had an average particle size of about 1.0 micron.

EXAMPLE I 92.9% by weight of the alumina powder, 2.85% by weight of the silica powder, 2.45% by weight of the talc and 1.8% by weight of calcium sulfate were milled in methanol at ambient temperature for about 3 hours. The resulting slurry was dried in air producing a sinterable ceramic particulate mixture containing the present oxidizing agent, calcium sulfate.

4 grams of commercially available organic binder comprised of polyvinylbutyral (average molecular weight of about 32,000), and 4 grams of a commercially available liquid plasticizer comprised of polyunsaturated hydroxylated low molecular weight organic polymers were dissolved at ambient temperature in a solution comprised of about 59 cc of toluene, about 40 cc of methyl isobutylketone and about 1 cc of an alcohol sold under the trademark Synasol. The resulting solution was admixed with the ceramic particulate mixture in a ball mill for about 4 hours at ambient temperature. The resulting fluid mixture was tape cast by doctor blading on a Mylar film, then dried in air to remove solvent and the resulting green sheet was stripped from the Mylar.

The green sheet, i.e. Sample A, had a thickness of about 0.5 mm. The polyvinylbutyral and the plasticizer were contained in the green sheet in an amount of about 30% by volume of the solids content of the sheet. The solids in the sheet had an average particle size of less than 3 microns.

A second green sheet, Sample B, was prepared in substantially the same manner as Sample A, except that 1.8% by weight of Wollastonite powder was substituted for the calcium sulfate.

Both sheets were fired at the same time in an atmosphere of hydrogen. Specifically, both samples were heated from ambient temperature to about 500° C. at a rate of about 3° C. per minute, from about 500° C. to about 1670° C. at a rate of about 5° C. per minute, held at 1670 for 80 minutes and then furnace cooled to ambient temperature. The dew point of the firing atmosphere was maintained at about 60° C. from room temperature to about 1200° C., then it was dropped to about 40° C. where it was maintained until furnace temperature fell to about 800° C. whereupon the dew point was dropped to about −35° C.

A polished cross-section of each of the resulting fired ceramic sheets was prepared and examined by optical microscopy. Sample A, which illustrates the present invention, was free of voids larger than about 5 microns and a green sheet thereof would be useful as a substrate for cofiring with refractory metal metallization in the production of a cofired structure comprised of the substrate with adherent metallization.

In contrast to Sample A, Sample B had large voids of the order of about 15 microns to about 30 microns and a green sheet thereof would not be useful in its green state as a substrate for cofiring with refractory metallization.

What is claimed is:

1. A process for producing a sintered structure comprised of a ceramic substrate and an adherent electrically conductive refractory metal metallization wherein said substrate is free of voids greater than about 5 microns and has a porosity of less than about 10% by volume which comprises forming a liquid phase sinterable ceramic composition consisting essentially of a ceramic powder and a liquid-forming material, said liquid-forming material containing an oxidizing agent and a member selected from the group consisting of silica, a source thereof and a mixture thereof, said member being present in an amount of at least about 0.5% by weight of said ceramic composition, admixing said composition with an organic binding material, said organic binding material pyrolyzing at an elevated temperature ranging to less than about 800° C. leaving a residue of elemental carbon, said oxidizing agent being selected from the group consisting of alkali metal sulfate, alkaline earth metal sulfate and mixture thereof and being used in an amount at least sufficient to react with the total amount of said residue of carbon, forming said mixture into a sheet, contacting said sheet with a refractory metal metallization material, firing the resulting structure at an elevated pyrolyzing temperature ranging to less than about 800° C. pyrolyzing said organic binding material leaving a residue of elemental carbon in the sheet, increasing the firing temperature to a decarburizing temperature ranging from about 800° C. to about 1200° C. but below the temperature at which closed porosity forms in the sheet reacting said oxidizing agent with said carbon thereby decarburizing the sheet, and increasing the firing temperature to a sintering temperature ranging from above 1300° C. to about 1900° C. producing said sintered structure, said liquid-forming material being a solid material which forms a liquid in situ at said sintering temperature in an amount which enables liquid phase sintering of said ceramic composition, said liquid-forming material being present in an amount ranging from about 1% by weight to about 15% by weight of said ceramic composition, said firing being carried out in an atmosphere or vacuum which is non-oxidizing with respect to said refractory metal.

2. The process according to claim 1 wherein said ceramic powder is alumina.

3. The process according to claim 1 wherein said liquid-forming material is a glass-forming material.

4. The process according to claim 1 wherein said source of silica is selected from the group consisting of aluminum silicate, alkali metal silicate, alkali metal aluminosilicate, alkaline earth metal silicate, alkaline earth metal aluminosilicate and a mixture thereof.

5. The process according to claim 1 wherein said oxidizing agent is selected from the group consisting of sodium sulfate, potassium sulfate, barium sulfate, calcium sulfate, magnesium sulfate, strontium sulfate and a mixture thereof.

9

6. The process according to claim 1 wherein said firing is carried out in an atmosphere or vacuum having a dew point of less than about 60° C.

7. The process according to claim 1 wherein said firing is carried out in an atmosphere or vacuum having a dew point of less than about 40° C.

8. The process according to claim 1 wherein said firing is carried out at ambient pressure.

9. The process according to claim 1 wherein said sintering temperature ranges from about 1350° C. to about 1900° C.

10. The process according to claim 1 wherein said substrate has a porosity of less than about 5% by volume.

11. The process according to claim 1 wherein said refractory metal is tungsten.

12. The process according to claim 1 wherein said refractory metal is molybdenum.

13. The process according to claim 1 wherein said refractory metallization material is printed on said sheet.

14. The process according to claim 1 wherein said structure is comprised of a multilayered ceramic substrate and an adherent electrically conductive refractory metal metallization, wherein vias or feed-through holes are formed in a preselected number of said sheets in a preselected manner, wherein said refractory metal metallization is contacted with a preselected number of said sheets in a preselected manner, wherein said sheets are superimposed on each other in a preselected manner, wherein the resulting structure is laminated to form a laminated structure, and wherein said laminated structure is fired to produce said sintered structure.

15. A process for producing a sintered structure comprised of a ceramic substrate and an adherent electrically conductive refractory metal metallization wherein said substrate is free of voids greater than about 5 microns and has a porosity of less than about 5% by volume which comprises forming a liquid phase sinterable ceramic composition consisting essentially of alumina powder and a liquid-forming material, said liquid-forming material containing calcium sulfate and a member selected from the group consisting of silica, aluminum silicate, alkali metal silicate, alkali metal aluminosilicate, alkaline earth metal silicate, alkaline earth metal aluminosilicate and a mixing thereof, said member being present in an amount of at least about 0.5% by weight of said ceramic composition, admixing said composition with an organic binding material, said organic binding material pyrolyzing at an elevated temperature ranging to less than about 800° C. leaving a residue of elemental carbon, said calcium sulfate being used in an amount at least sufficient to react with the total amount of said residue of carbon, forming said mixture into a sheet, contacting said sheet with a refractory metal metallization material, firing the resulting structure at an elevated pyrolyzing temperature ranging to less than about 800° C. pyrolyzing said organic binding material leaving a residue of elemental carbon in the sheet, increasing the firing temperature to a decarburizing temperature ranging from about 800° C. to about 1200° C. but below the temperature at which closed porosity forms in the sheet reacting said calcium sulfate with said carbon thereby decarburizing the sheet, and increasing the firing temperature to a sintering temperature ranging from about 1450° C. to about 1700° C. producing said sintered structure, said liquid-forming material being a solid material which forms a liquid situ at said sintering temperature in an amount which enables liquid phase sintering of said ceramic composition, said liquid-forming material being present in an amount ranging from about 1% by weight to about 15% by weight of said ceramic composition, said firing being carried out in an atmosphere or vacuum having a dew point of less than about 40° C.

16. The process according to claim 15 wherein said liquid-forming material is a glass-forming material.

17. The process according to claim 15 wherein said sintered structure is comprised of a multilayered ceramic substrate and an adherent electrically conductive refractory metal metallization, wherein a plurality of said sheets are formed, wherein vias or feed-through holes are formed in a preselected number of said sheets in a preselected manner, wherein said refractory metal metallization is contacted with a preselected number of said sheets in a preselected manner, wherein said sheets are superimposed on each other in a preselected manner, wherein the resulting structure is laminated to form a laminated structure, and wherein said laminated structure is fired to produce said sintered structure.

18. The process according to claim 1 wherein said source of silica is selected from the group consisting of aluminum silicate, sodium silicate, potassium silicate, barium silicate, calcium silicate, magnesium silicate, strontium silicate, sodium aluminosilicate, potassium aluminosilicate, barium aluminosilicate, calcium aluminosilicate, magnesium aluminosilicate, strontium aluminosilicate and a mixture thereof.

19. The process according to claim 1 wherein said member ranges from about 1% by weight to about 3% by weight of said ceramic composition.

20. The process according to claim 1 wherein said liquid-forming material ranges from about 2% by weight to about 10% by weight of said ceramic composition.

21. The process according to claim 1 wherein said oxidizing agent is calcium sulfate.

22. The process according to claim 15 wherein said member is selected from the group consisting of silica, aluminum silicate, sodium silicate, potassium silicate, barium silicate, calcium silicate, magnesium silicate, strontium silicate, sodium aluminosilicate, potassium aluminosilicate, barium aluminosilicate, calcium aluminosilicate, magnesium aluminosilicate, strontium aluminosilicate and a mixture thereof.

23. The process according to claim 15 wherein said member ranges from about 1% by weight to about 3% by weight of said ceramic composition.

24. The process according to claim 15 wherein said liquid-forming material ranges from about 2% by weight to about 10% by weight of said ceramic composition.

25. The process according to claim 15 wherein said refractory metal metallization material is printed on said sheet.

26. A process for producing a sintered structure comprised of a ceramic substrate and an adherent electrically conductive refractory metal metallization wherein said substrate is free of voids greater than about 5 microns and has a porosity of less than about 5% by volume which comprises forming a liquid phase sinterable ceramic composition consisting essentially of a ceramic powder and a liquid-forming matetial, said ceramic powder being selected from the group consisting of alumina, aluminum nitride, mullite-cordierite compositions and silicon nitride, said liquid-forming material containing an oxidizing agent and a member selected from the group consisting of silica, aluminum silicate, sodium silicate, potassium silicate, barium silicate, calcium silicate, magnesium silicate, strontium silicate, sodium aluminosilicate, potassium aluminosilicate, barium aluminosilicate, calcium aluminosilicate, magnesium aluminosilicate, strontium aluminosilicate and a mixture thereof, said member being present in an amount of at least about 0.5% by weight of said ceramic composition, admixing said composition with an organic binding material, said organic binding material pyrolyzing at an elevated temperature ranging to less than about 800° C. leaving a residue of elemental carbon, said oxidizing agent being selected from the group consisting of sodium sulfate, potassium sulfate, barium sulfate, calcium sulfate, magnesium sulfate, strontium sulfate and a mixture thereof, said oxidizing agent being used in an amount at least sufficient to react with the total amount of said residue of carbon, forming said mixture into a sheet, contacting said sheet with a refractory metal metallization material, firing the resulting structure at an elevated pyrolyzing temperature ranging to less than about 800° C. pyrolyzing said organic binding material leaving a residue of elemental carbon in the sheet, increasing the firing temperature to a decarburizing temperature ranging from about 800° C. to about 1200° C. but below the temperature at which closed porosity forms in the sheet reacting said oxidizing agent with said carbon thereby decarburizing the sheet, and increasing the firing temperature to a sintering temperature ranging from about 1300° C. to about 1900° C. producing said sintered structure, said liquid-forming material being a solid material which forms a liquid in situ at said sintering temperature in an amount which enables liquid phase sintering of said ceramic composition, said liquid-forming material being present in an amount ranging from about 1% by weight to about 15% by weight of said ceramic composition, said firing being carried out in an atmosphere or vacuum which is non-oxidizing with respect to said refractory metal.

27. The process according to claim 26 wherein said member ranges from about 1% by weight to about 3% by weight of said ceramic composition.

28. The process according to claim 26 wherein said liquid-forming material ranges from about 2% by weight to about 10% by weight of said ceramic composition.

29. The process according to claim 26 wherein said oxidizing agent is calcium sulfate.

30. The process according to claim 26 wherein said refractory metal metallization material is printed on said sheet.

31. The process according to claim 26 wherein said sintered structure is comprised of a multilayered ceramic substrate and an adherent electrically conductive refractory metal metallization, wherein a plurality of said sheets are formed, wherein vias or feed-through holes are formed in a preselected number of said sheets in a preselected manner, wherein said refractory metal metallization is contacted with a preselected number of said sheets in a preselected manner, wherein said sheets are superimposed on each other in a preselected manner, wherein the resulting structure is laminated to form a laminated structure, and wherein said laminated structure is fired to produce said sintered structure.

* * * * *